US008155174B2

(12) United States Patent
Kim et al.

(10) Patent No.: US 8,155,174 B2
(45) Date of Patent: Apr. 10, 2012

(54) HARDWARE AND METHOD TO TEST PHASE LINEARITY OF PHASE SYNTHESIZER

(75) Inventors: Jaeha Kim, Los Altos, CA (US);
Hae-Chang Lee, Los Altos, CA (US);
Thomas H. Greer, III, Chapel Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 408 days.

(21) Appl. No.: 12/531,830

(22) PCT Filed: Mar. 14, 2008

(86) PCT No.: PCT/US2008/056952
§ 371 (c)(1),
(2), (4) Date: Sep. 17, 2009

(87) PCT Pub. No.: WO2008/118659
PCT Pub. Date: Oct. 2, 2008

(65) Prior Publication Data
US 2010/0102868 A1 Apr. 29, 2010

Related U.S. Application Data

(60) Provisional application No. 60/896,833, filed on Mar. 23, 2007.

(51) Int. Cl.
*H04B 3/46* (2006.01)
(52) U.S. Cl. ..................................... 375/224
(58) Field of Classification Search ............... 375/224, 375/226; 327/105, 156; 702/106
See application file for complete search history.

(56) References Cited

U.S. PATENT DOCUMENTS

| 4,963,839 A * | 10/1990 | Stacey ........................... 331/17 |
| 6,198,321 B1 * | 3/2001 | Lebouleux et al. ............ 327/159 |
| 6,400,129 B1 * | 6/2002 | Yamaguchi et al. ....... 324/76.82 |
| 2003/0152181 A1 * | 8/2003 | Stengel et al. ................. 375/371 |
| 2005/0007203 A1 | 1/2005 | Chen .............................. 331/45 |

OTHER PUBLICATIONS

International Preliminary Report on Patentablility, mailed Oct. 8, 2009, received in International Application No. PCT/US2008/056952.
Arabi et al., "On Chip Testing Data Converters Using Static Parameters," IEEE Transactions on Very Large Scale Integration (VLSI) Systems, vol. 6, No. 3, Sep. 1998, pp. 409-419.
International Search Report and Written Opinion issued in PCT/US2008/056952, Jul. 4, 2008, 12 pages.

* cited by examiner

*Primary Examiner* — Don N Vo
(74) *Attorney, Agent, or Firm* — Morgan, Lewis & Bockius LLP

(57) ABSTRACT

A circuit to test phase linearity of a phase synthesizer, which synthesizes an output clock having a phase corresponding to a digital phase value input to the phase synthesizer. A digital counter provides the digital phase value to the phase synthesizer. The digital counter receives a counter clock synchronized with an input clock. The digital phase value is stepped by the digital counter, thereby shifting the frequency of the output clock. The output clock is analyzed with respect to phase linearity of the phase synthesizer to produce a phase linearity analysis output.

33 Claims, 9 Drawing Sheets

HARDWARE AND METHOD TO TEST PHASE LINEARITY OF PHASE SYNTHESIZER

CROSS REFERENCE TO RELATED APPLICATIONS

This application is a United States National Stage Application filed under 35 U.S.C. §371 of PCT Patent Application Ser. No. PCT/US2008/056952 filed on Mar. 14, 2008, which claims the benefit of and priority to U.S. Provisional Patent Application Ser. No. 60/896,833 filed on Mar. 23, 2007, the disclosures of which are hereby incorporated by reference in their entirety.

FIELD

The subject matter herein generally relates to circuits and methods for determining the phase linearity of a phase synthesizer.

BACKGROUND

Many clock generation and clock recovery circuits use phase synthesizers to synthesize an arbitrary output clock that is phase controlled by an N-bit digital input word. A phase synthesizer typically consists of a multiplexer that is used to select two clock phases out of multiple input clock phases and a phase interpolator that generates a clock phase between the two selected clock phases. A phase synthesizer is similar to a digital-to-analog converter (DAC) except that the output is a phase of a periodic waveform rather than a specific voltage. Accordingly, phase synthesizers are sometimes referred to as phase D/A converters or phase DACs. As in D/A converters, the nonlinearities in the input-to-output transfer characteristics are of concern and need to be measured and characterized. The current methods used to measure these phase nonlinearities are overly time-consuming and therefore are not suitable for high-volume product screening environments. For example, it takes approximately one hour with an oscilloscope to measure the average phase position for each digital setting of a phase DAC.

There is a need, therefore, for methods and circuitry for shortening the time needed to characterize nonlinearities in phase DACs.

BRIEF DESCRIPTION OF THE DRAWINGS

For a better understanding, reference should be made to the following detailed description taken in conjunction with the accompanying drawings, in which.

Like reference numerals refer to the same or similar components throughout the several views of the drawings.

DETAILED DESCRIPTION OF THE EMBODIMENTS

Described in more detail below is a circuit to test phase linearity of a phase synthesizer, which synthesizes an output clock having a phase corresponding to a digital phase value input to the phase synthesizer. A digital counter provides the digital phase value to the phase synthesizer. The digital counter receives a counter clock synchronized with an input clock. The digital phase value is stepped by the digital counter, thereby shifting the frequency of the output clock with respect to the frequency of the input clock. The output clock is analyzed with respect to phase linearity of the phase synthesizer to produce a phase linearity analysis output.

As described in more detail below, in some embodiments a method of determining the phase linearity of a phase synthesizer includes periodically stepping the phase of the output clock of the phase synthesizer by a fixed step, obtaining a frequency spectrum of the output clock of the phase synthesizer, measuring sideband peaks in the frequency spectrum, and converting the measurements of the sideband peaks into values representing the phase linearity of the phase synthesizer.

Figure 1:
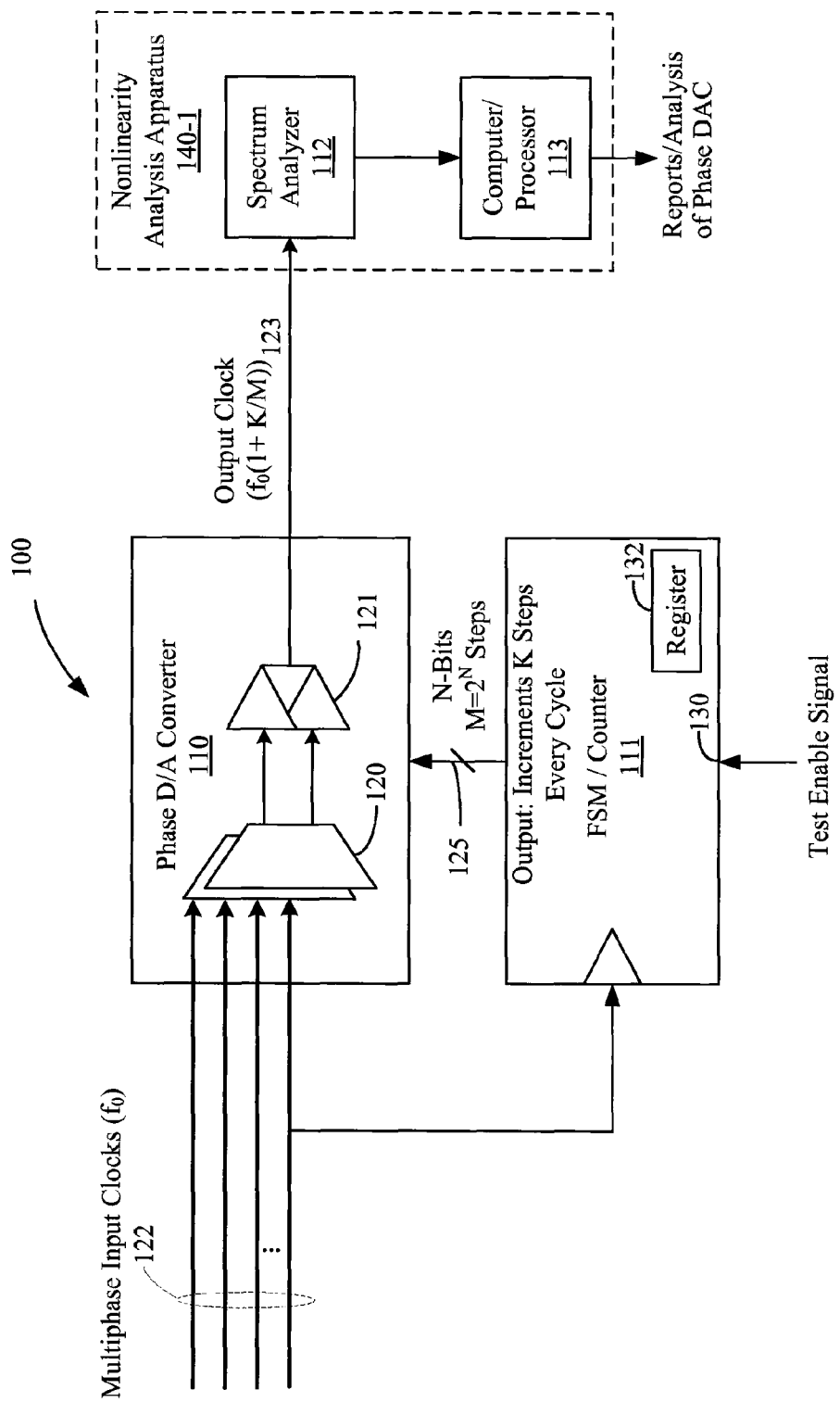
FIG. 1 is a block diagram of an embodiment of a circuit that can be used to characterize nonlinearities of a phase DAC.

FIG. 1 is a block diagram of an embodiment of a circuit 100 that can be used to characterize nonlinearities of a phase synthesizer, also known as a phase DAC. The circuit 100 includes a phase DAC 110 and a finite state machine (FSM) or counter 111. The phase DAC 110 receives a set of input clocks 122 all having frequency $f_0$, but having different, uniformly-spaced phases spanning $2\pi$ (e.g. four input clocks having relative phases of 0, $\pi/2$, $\pi$, $3\pi/2$), and generates an output clock 123 having a frequency of $f_0(1+K/M)$, as described in more detail below. While the phases of the input clocks 122 change continuously, the term "phase" is sometimes used in this document to mean the phase offset between two input clocks. Thus the "phase" of each input clock is the relative phase with respect to one of the input clocks (which has a "zero" phase relative to itself). The input clocks 122 may be generated, for example, by a phase locked loop (PLL) or delay locked loop (DLL). One of the input clocks 122 is also coupled to the clock input of the FSM/counter 111. FSM/counter 111 generates an N-bit digital output word 125 corresponding to a particular phase. The N-bit digital output word 125 is received by phase DAC 110.

The phase DAC 110 includes a phase multiplexer 120 and a phase interpolator 121. The phase multiplexer 120 receives the multiple input clocks 122, and selects two of the input clocks, having two distinct phases. Each of the multiple clock outputs from the phase multiplexer 120 is coupled to the input of the phase interpolator 121. The phase interpolator 121 interpolates the two clock phases selected by the phase multiplexer 120, generates an output clock 123 having a phase that is between the phases of the selected input clocks, and outputs it as output clock 123. The N-bit digital word 125 received by phase DAC 110 determines which particular phase is generated as output clock 123.

The FSM/counter 111 includes a finite state machine and a counter. In normal operation, FSM/counter 111 is configured as a finite state machine used to control the phase DAC 110 in order to track a reference signal. When a test mode is enabled, the FSM/counter 111 can also operate as a counter for use in testing the linearity of the phase DAC 110. The counter includes a clock input and can increment (or decrement) sequentially in fixed steps set to an increment value K. The increment K can be hardwired into the counter circuit or can be programmed using a register, configuration pin, or fuse option.

The output of the phase DAC 110 is coupled to a nonlinearity analysis apparatus 140 (labeled 140-1 in the embodiment shown in FIG. 1), which analyzes the output clock 123 to determine properties of the phase DAC 110. In some embodiments, the nonlinearity analysis apparatus 140 includes a spectrum analyzer 112 that is coupled to the output of the phase DAC 110 so as to measure and characterize the nonlinearities of the phase DAC 110. In some embodiments, nonlinearity analysis apparatus 140 includes a computer or processor 113 coupled to the spectrum analyzer 112. Spectrum analyzer 112 receives output clock 123 and provides the frequency spectrum of output clock 123 to computer/processor 113. Alternatively, the spectrum data can be displayed.

In test mode, the FSM/counter 111 functions as a counter that increments or decrements the phase DAC input by a fixed increment (e.g., K steps) every cycle of the input clock, thereby advancing the phase of the phase DAC. The selection of modes can be determined by the logic level of a test enable pin 130, or alternatively, by the state of one or more bits in a register (e.g., a register 132 in the FSM/counter 111, or a register 314 (FIG. 6A) external to the FSM/counter 111). Further, the same circuitry can be used to implement both the FSM and counter.

If the phase DAC 110 has some nonlinearity in its digital-to-phase transfer function, e.g., each phase step is not the same in magnitude, the instantaneous frequency of the synthesized output clock 123 fluctuates from cycle to cycle, but in a repeated fashion. The period of this fluctuation is $M/(K \cdot f_0)$, or M/K cycles of the input clock given that M/K is an integer value. The repeated fluctuation in frequency gives rise to discrete sideband spurs in the power spectral density (PSD) of output clock 123. These sideband spurs are measured by spectrum analyzer 112. Once these sideband spurs are determined, they can be used to characterize the nonlinearity of the phase DAC 110. Such characterization can be performed by computer/processor 113, which may include one or more central processing units, memory, and one or more procedures stored in the memory and executable by the one or more central processing units to analyze the data produced the spectrum analyzer 112 so as to produce a nonlinearity analysis of the phase DAC 110. The nonlinearity analysis may be output as data that is displayed or transmitted to another device (e.g., a server or client computer). Alternatively, spectrum analyzer 112 can output spectrum data for storage or further process that spectrum data using its own processor.

Figure 2:
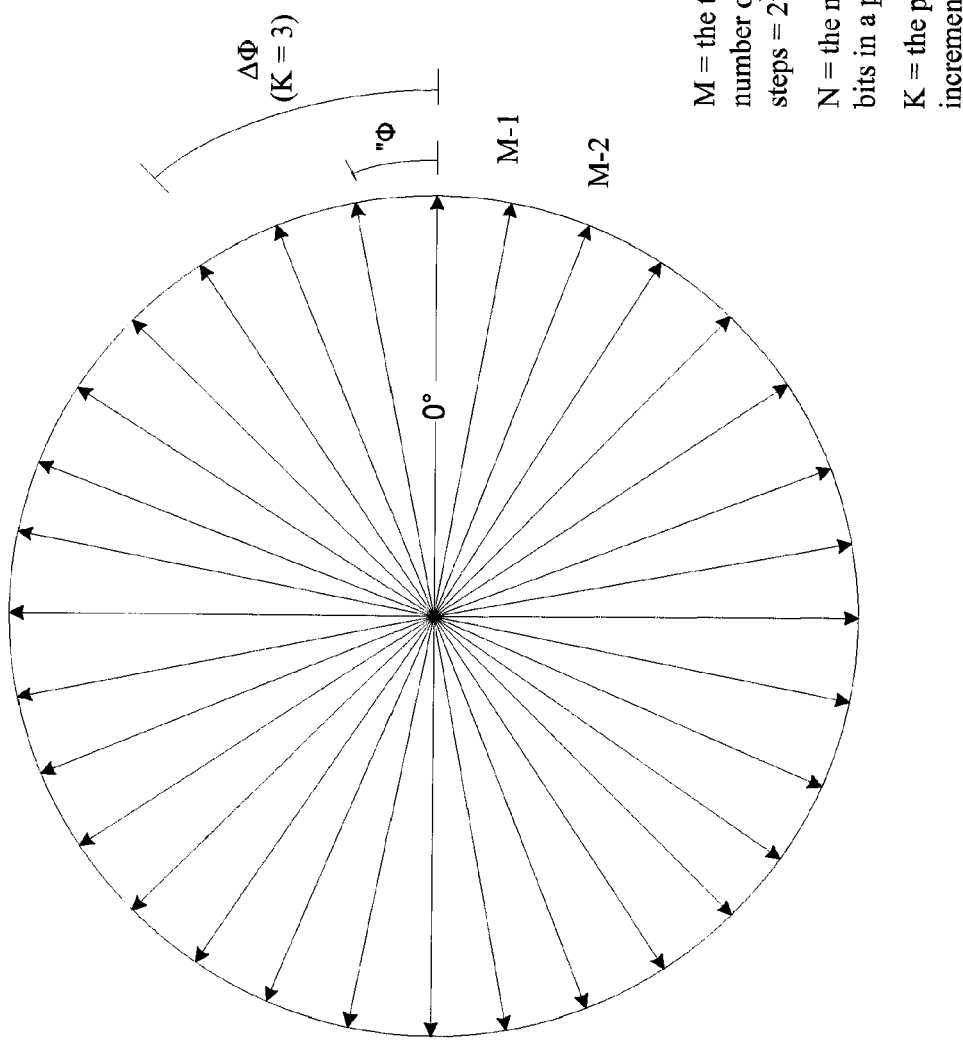
FIG. 2 illustrates possible phase steps of a phase DAC.

FIG. 2 illustrates the possible phase steps of phase DAC 110 that can be selected by an N-bit phase word. As shown, the phase DAC 110 has M possible steps with a step interval of $\Delta\Phi$. Each phase can be selected by the N-bit phase word. If the phase word is incremented by a step index of K, then the next phase step will advance by $2\pi K/M$. Assuming, for example, that the phase step increment K equals 1, then during test mode, the FSM/counter 111 increments the N-bit phase word by one phase step for each clock cycle of the input clock 122, thereby advancing the phase of the phase DAC by $2\pi/M$. If, for example, the phase step increment K equals 3, then the FSM/counter 111 increments (or decrements) the N-bit phase word by three phase steps for each clock cycle of the input clock 122, thereby advancing the phase of the phase DAC by $6\pi/M$.

Figure 3:
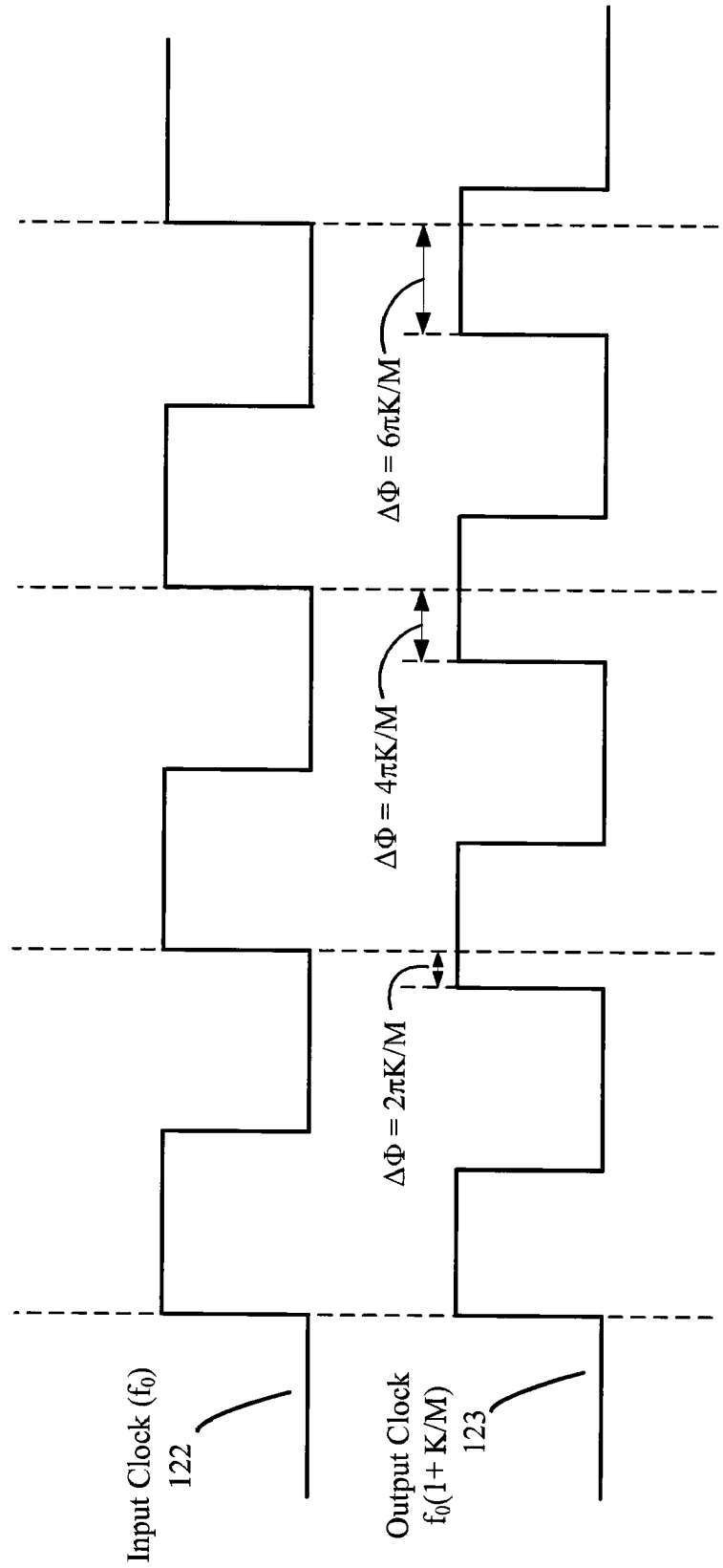
FIG. 3 illustrates a stepped output phase of a phase DAC in relation to an input clock.

FIG. 3 illustrates the output clock 123 produced by phase DAC 110 (FIG. 1) in relation to one of the input clocks 122. Input clock 122 is shown having a frequency $f_0$, while the output clock has an output frequency of $f_0 \cdot (1+K/M)$, where $2\pi \cdot K/M$ is the phase increment that occurs once per input clock cycle. In this exemplary embodiment, the phase of the output clock 123 is advanced by $2\pi \cdot K/M$ at each upward transition of the input clock 122. In other embodiments, the phase increment could occur at the downward transition of the input clock, or at another time during the input clock cycle. FIG. 3 shows the impact of the successive phase advances, once per input clock cycle. With an increment K equal to 1, the amount of phase increment $\Delta\Phi$ of output clock 123 per cycle of input clock 122 is $2\pi \cdot (K/M)$ radians, thereby causing output clock 123 to have a frequency of $f_0 \cdot (1+K/M)$. The frequency of the output clock 123 can be generalized to be $f_0 \cdot (1+K/M)$.

Figure 4:
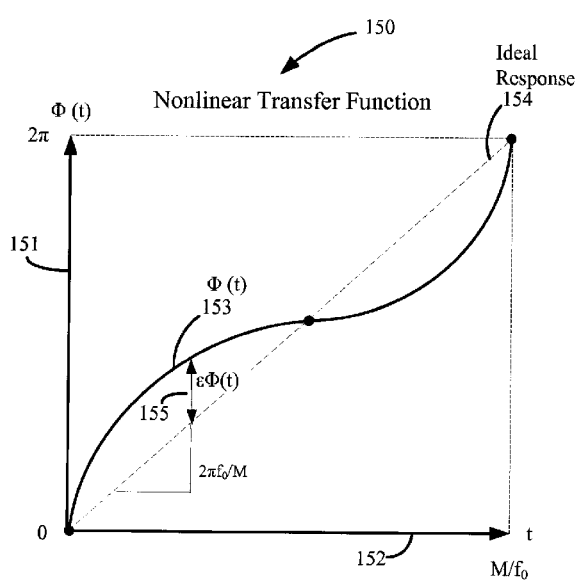
FIG. 4 is a time-phase plot illustrating a nonlinear transfer function.

FIG. 4 is a time-phase plot illustrating a nonlinear transfer function 150 of the phase DAC 110 and an ideal transfer function of an ideal phase DAC. In this example, K=1, and thus the output clock has a nominal frequency of $f_0 \cdot (1+1/M)$. In the plot, the x-axis 152 represents time and the y-axis 151 represents phase output of a phase DAC. A linear response curve 154 of an ideal phase DAC is shown. As the selected phase is periodically incremented in time, the output clock phase of the ideal phase DAC increments in a linear fashion. The slope of the ideal linear transfer function is $2\pi f_0/M$. The phase of an output clock produced by an ideal phase DAC is $2\pi f_0 t/M + \alpha$, where a is a constant phase offset. In FIG. 4, $\alpha=0$.

A non-ideal response curve 153 is also shown in FIG. 4. In this plot, as the selected phase of nonlinear phase DAC 110 is periodically incremented in time, the phase $\Phi(t)$ 153 of the output clock of phase DAC 110 increments in a non-linear fashion. At a given time, the deviation of the phase $\Phi(t)$ of DAC 110 from the phase of an ideal phase DAC is represented by $\epsilon\Phi(t)$ 155.

In a phase DAC, the phase DAC INL (integral nonlinearity) determines the absolute jitter of the output clock and the phase DAC DNL (differential nonlinearity) determines the cycle-to-cycle jitter, where a cycle refers to a cycle of the output clock, e.g., output clock 123. As the phase DAC input is swept through a complete revolution of phase steps (e.g., from 0 to M−1), the phase $\Phi(t)$ of the output clock follows the trajectory of $2\pi f_0 t/M + \epsilon\Phi(t)$, where $2\pi f_0 t/M$ is the nominal phase shift expected from an ideal phase DAC, and $\epsilon\Phi(t)$ is the error. $\epsilon\Phi(t)$ represents the jitter in radians compared to an ideal clock (e.g., an output clock with frequency of $f_0 \cdot (1+1/M)$), and also represents the INL of the phase DAC. In a phase DAC, the phase DNL is defined as the error in each phase step compared to the ideal value of $2\pi/M$. This error is defined by $\epsilon\Phi(t+1/f_0) - \epsilon\Phi(t)$ and quantifies the cycle-to-cycle jitter of the output clock in radians. When the step size per clock cycle is K, the ideal output clock frequency is $f_0 \cdot (1+K/M)$, and $\epsilon\Phi(t)$ represents the jitter in radians of the output clock compared with that ideal output clock frequency.

Figure 5:
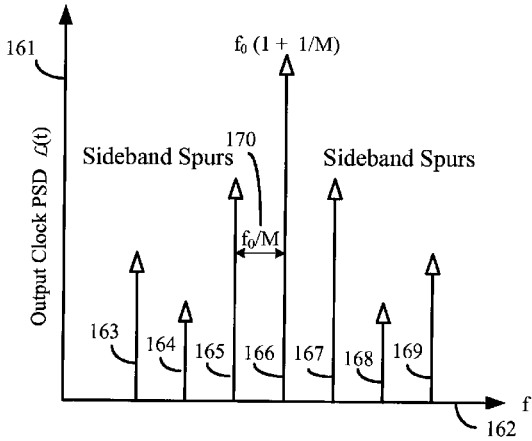
FIG. 5 illustrates a prophetic example of noise measurements resulting from the phase nonlinearity of the transfer function shown in FIG. 4.

FIG. 5 is an illustration of a prophetic example of noise measurements (output clock PSD 161 as a function of frequency 162) resulting from the phase nonlinearity of the transfer function 153 shown in FIG. 4. Nonlinearities in the phase DAC 110 cause sideband spurs 163, 164, 165 and 167, 168, 169 to be present in the phase noise power spectrum. In this example, output clock 123 of the phase DAC 110 is stepped forward by a phase step increment of 1 for each cycle of an input clock having a clock frequency of $f_0$. The clock frequency is thereby shifted from $f_0$ to $f_0 \cdot (1+1/M)$. Consequently, the output clock PSD 161 has a main peak 166 located at $f_0 \cdot (1+1/M)$. Since the phase nonlinearity pattern repeats itself every M input clock cycles, the sideband peaks are spaced (along the frequency axis) by $f_0/M$ 170, symmetric around the main peak.

From the phase noise spectrum L(f) (in dBc/Hz) of the output clock 123, we can estimate the RMS (root mean square) INL and RMS DNL of the phase DAC 110 by applying two integral equations for converting the phase noise to the absolute jitter and cycle-to-cycle jitter. The integral equations can be rewritten as summations since only the discrete sidetones due to the phase DAC nonlinearities are of interest. The equations for calculating RMS INL and RMS DNL, in radians, are:

$$\text{RMS } INL = \frac{1}{\pi} \sum_{k=1}^{M/2} \mathcal{L}(k \cdot f_0/M)$$

and $$\text{RMS } DNL = \frac{4}{\pi} \sum_{k=1}^{M/2} \mathcal{L}(k \cdot f_0/M) \cdot \sin^2(k\pi/(M+1))$$

The above equations may need to be scaled by a constant depending on the conventions on L(f), e.g., where L(f) represents single sideband or double sideband spectrum measurements. Using these equations, the RMS INL and RMS DNL can be calculated for the phase DAC 110 shown in FIG. 1.

While typical spectrum analyzers measure only the power spectrum of a signal, some spectrum analyzers, such as those with fast Fourier transform (FFT) algorithms can measure the complete frequency spectrum, i.e., both the magnitude and phase of a signal across a range of frequencies. With the latter spectrum analyzers, it is possible to reconstruct the error signal $\epsilon\Phi(t)$ (also herein called the $\epsilon\Phi(t)$ waveform) using the sideband magnitudes and phases measured by a spectrum analyzer. The formulation can employ a narrowband-FM approximation, so long as $\epsilon\Phi(t)$ has a magnitude of less than 0.2 radians. If the error signal $\epsilon\Phi(t)$ is expressed in a Fourier series, as follows $$\varepsilon\Phi(t) = \sum_{k=-M/2}^{M/2} C_k e^{j2\pi k f_0 t/M}$$

the Fourier coefficients, $C_k$, can be found by normalizing the complex (i.e., real and imaginary) components of the sideband peaks with respect to the complex (i.e., real and imaginary) component of the main peak.

The calculations discussed above for determining INL and DNL of a phase DAC are normally performed using a computer processor. The processor can be an integral part of a spectrum analyzer or may be a separate unit that receives spectrum data from the spectrum analyzer. Further, the processor can be part of an automated test setup in order to efficiently characterize chips under test in a production environment. Pass-fail criteria may be set for automatically screening chips for acceptable INL and DNL values. Further, using this method, input-to-output phase transfer functions can be obtained and stored for each chip.

In most clock generation or recovery systems, the input clock may have sideband spurs due to periodic noise mechanisms unrelated to the phase DAC, in which case the output clock's PSD may show sideband spurs spaced at the reference frequency or at some other frequencies present in the system, even when the phase DAC input is fixed. To distinguish the spurs due to nonlinearities in the phase DAC from those of other periodic noises, the phase DAC output clock can be divided down to remove the unrelated spurs. For example, assume the phase increment K equals 1. If the phase DAC steps by 1 phase increment every L cycles (instead of every cycle) and the output clock is divided by L, the divided output clock will have a frequency of $f_0 \cdot (1+1/ML)/L$ and an instantaneous phase error of $\epsilon\Phi(t/L)$, where $\epsilon\Phi(t)$ is the phase error in the undivided case. As discussed in more detail below, additional circuits may be necessary such as a divider to lower the counter's update rate (e.g., update each four cycles instead of one) and a divider to scale down the output clock frequency.

In some cases, if M (i.e., the number of phase steps in the phase DAC) is a large number, the spacing between the sideband peaks may be too narrow for accurate measurement. In that case, the output clock can further be divided by an integer P, which is equivalent to making the phase DAC input increment P steps every P·L input clock cycles. An alternate way is to increase the phase DAC input increment from 1 step to P steps (P steps every L input clock cycles) without the division of the output clock by an additional factor of P. The difference between the two methods is the output clock frequency, $f_0/(P \cdot L)$ in the former method and $f_0/L$ in the latter method. Both methods require that P separate measurements be made to collect the complete INL and DNL data, but the spacing between sideband peaks increases by a factor of P. For these reasons, additional circuits may be necessary such as a divider to further scale down the output clock frequency or a larger-step (P) incrementer for the phase DAC input.

Figure 6A:
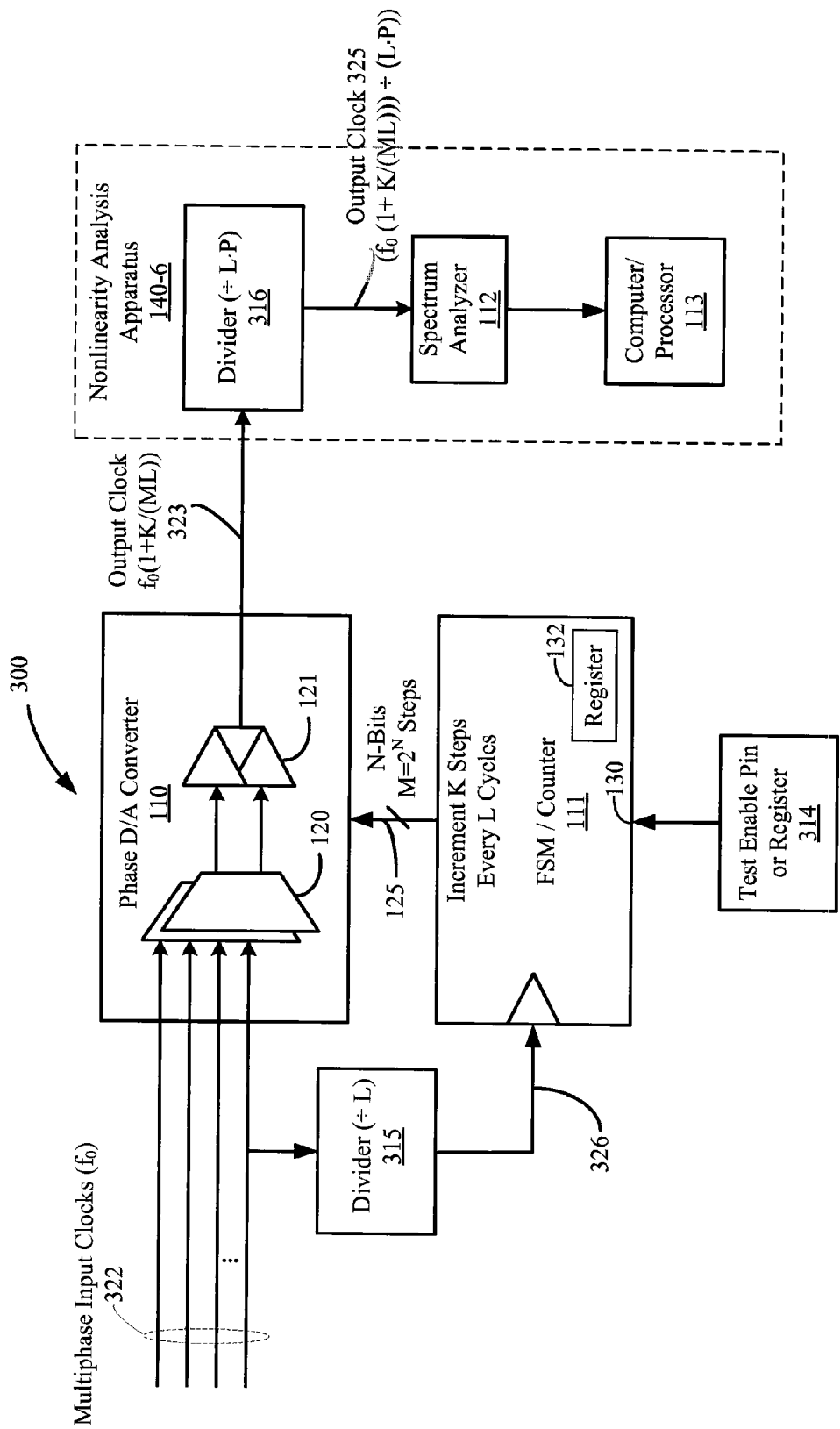
FIGS. 6A and 6B are block diagrams of circuits that can be used to characterize nonlinearities of a phase DAC, in accordance with some embodiments.

FIG. 6A is a block diagram of another embodiment of a circuit that can be used to characterize nonlinearities of a phase DAC. The circuit 300 of FIG. 6 utilizes the aforementioned dividers in order to alleviate the problems associated with sideband spurs created by mechanisms other than the phase DAC nonlinearity and overly narrow spacing of sideband spurs. The circuit 300 includes a phase D/A converter (phase DAC) 110, a FSM/counter 111, and dividers 315 and 316. The phase DAC 110 receives a set of multi-phase input clocks 322 all having a frequency $f_0$ but having different, uniformly-spaced phases spanning $2\pi$ radians (e.g., four clocks with phase offsets of 0, $\pi/2$, $\pi$, and $3\pi/2$) and generates an output clock 323 having an frequency of $f_0 \cdot (1+K/ML)$. One of the input clocks 322 is also coupled to divider circuit 315. Divider circuit 315 divides input clock 322 by an integer L. The output 326 of divider 315 is coupled to the clock input of the FSM/counter 111. FSM/counter 111 generates an N-bit digital output word 125 corresponding to a particular phase. The N-bit digital output word 125 is received by phase DAC 110. Divider 316 receives output clock 323 and divides the output clock 323 by an integer L to produce a lower frequency output clock 325, having a frequency of $f_0 \cdot (1+K/ML)/L$. Alternatively, divider 316 can divide output clock 323 by an integer multiple of L (e.g., L·P where P is an integer that is independent of L and K), or can be replaced by two frequency dividers, the first divider dividing by L and the second divider dividing by P or any other suitable integer. Dividers 315 and 316 can be hardwired to divide by particular values, or in the alternative, may be programmed using a configuration register, pins or fuse options. The resulting output clock 325 has a frequency of, having a frequency of $f_0 \cdot (1+K/ML)/(LP)$ In the embodiment shown in FIG. 6A, nonlinearity analysis apparatus 140-6 is coupled to the output of phase DAC 110 and receives and analyses the output clock 323. In this embodiment the nonlinearity apparatus 140-6 includes the aforementioned divider 316, spectrum analyzer 112 and computer or processor 113. The spectrum analyzer 112 receives the divided output of divider 316 and, optionally, provides a visual output of its frequency spectrum. Spectrum analyzer 112 can also provide an output in the form of digital data for storage or for use by computer/processor 113. Alternatively, spectrum analyzer 112 can further process the spectrum data using its own internal processor.

Divider 315 causes the phase of phase DAC 110 to be swept more slowly, for example, one phase step every four input clock 322 cycles. This will cause any nonlinearity in the input-to-output transfer function of the phase DAC 110 to repeat more slowly. Dividing output clock by a factor of L using divider 316 removes unwanted extraneous periodic signals such as sidebands present in the input clock 322. In particular, dividing the output clock by a factor of L removes extraneous periodic signals having a frequency of either $f_0/L$ or an integer multiple of $f_0/L$. Thus, using divider 315 and 316, the circuit can eliminate sidebands generated by sources other than phase DAC.

The output clock 323 can further be divided by a factor of P (or any other suitable integer) using divider 316 in order to widen the spacing between the sideband spurs. As previously mentioned, dividing by a factor of P will require that P separate measurements be made in order to obtain INL and DNL data for all phases of the phase DAC. To make these additional measurements, divider 316 can be temporarily disabled for one cycle of the output clock 523 in order to shift to the next set of INL and DNL data. For this purpose, divider 316 can also be configured as a dual modulo counter. Thus, using divider 316, the circuit can provide more accurate sideband spur measurements by spreading the sideband spurs in frequency.

Figure 6B:
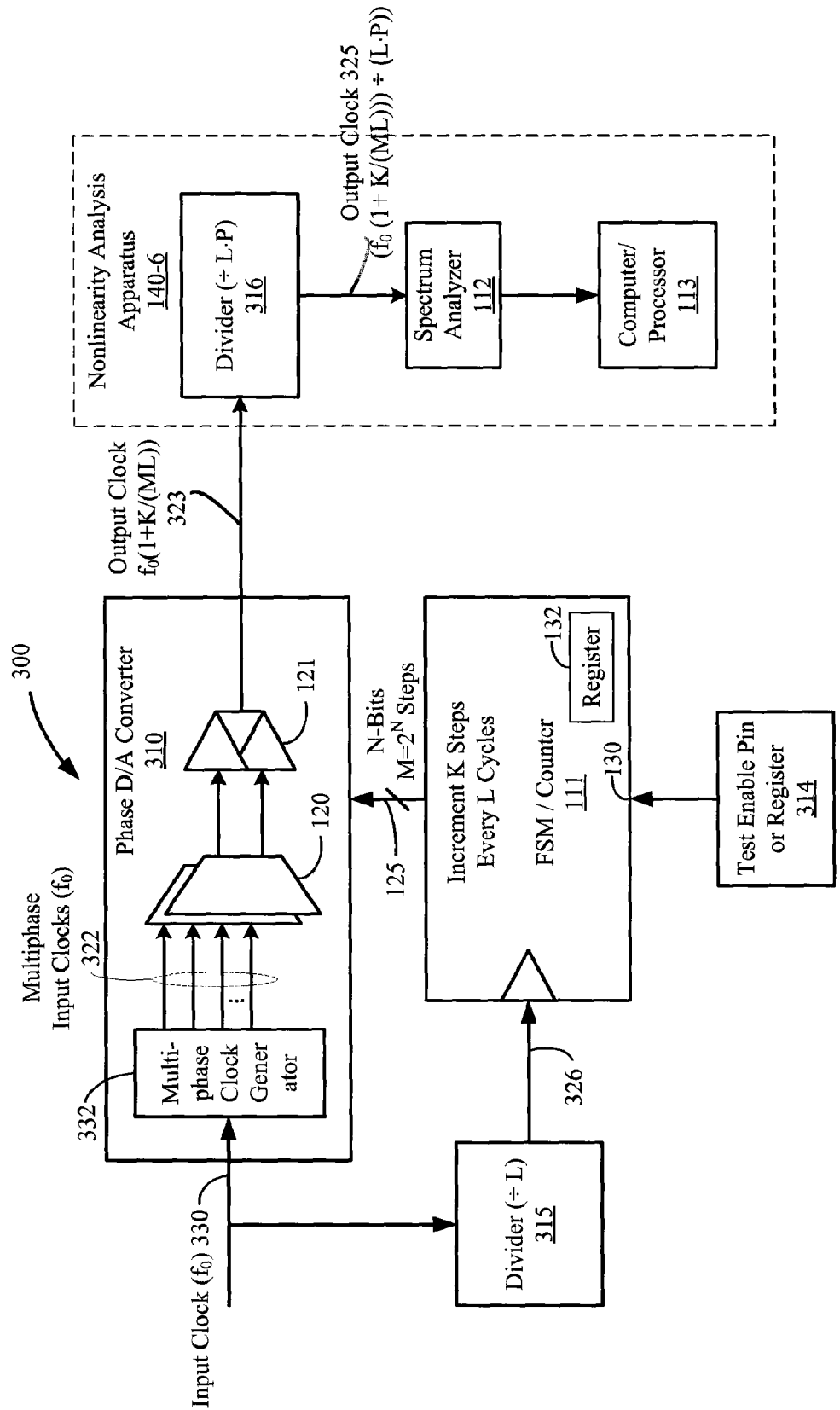

FIG. 6B represents an embodiment that is similar to FIG. 6A, except that the phase DAC 310 in FIG. 6B includes a multiphase clock generator 332 that receives an input clock 330 having a frequency of $f_0$ and produces N (e.g., four) multiphase input clocks 322 having evenly spaced phase offsets. In this embodiment, the input clock 330 drives the divider 315. The nonlinearity analysis generated by the nonlinearity analysis apparatus 140-6 includes any nonlinearities associated with the multiphase clock generator 332.

Figure 7A:
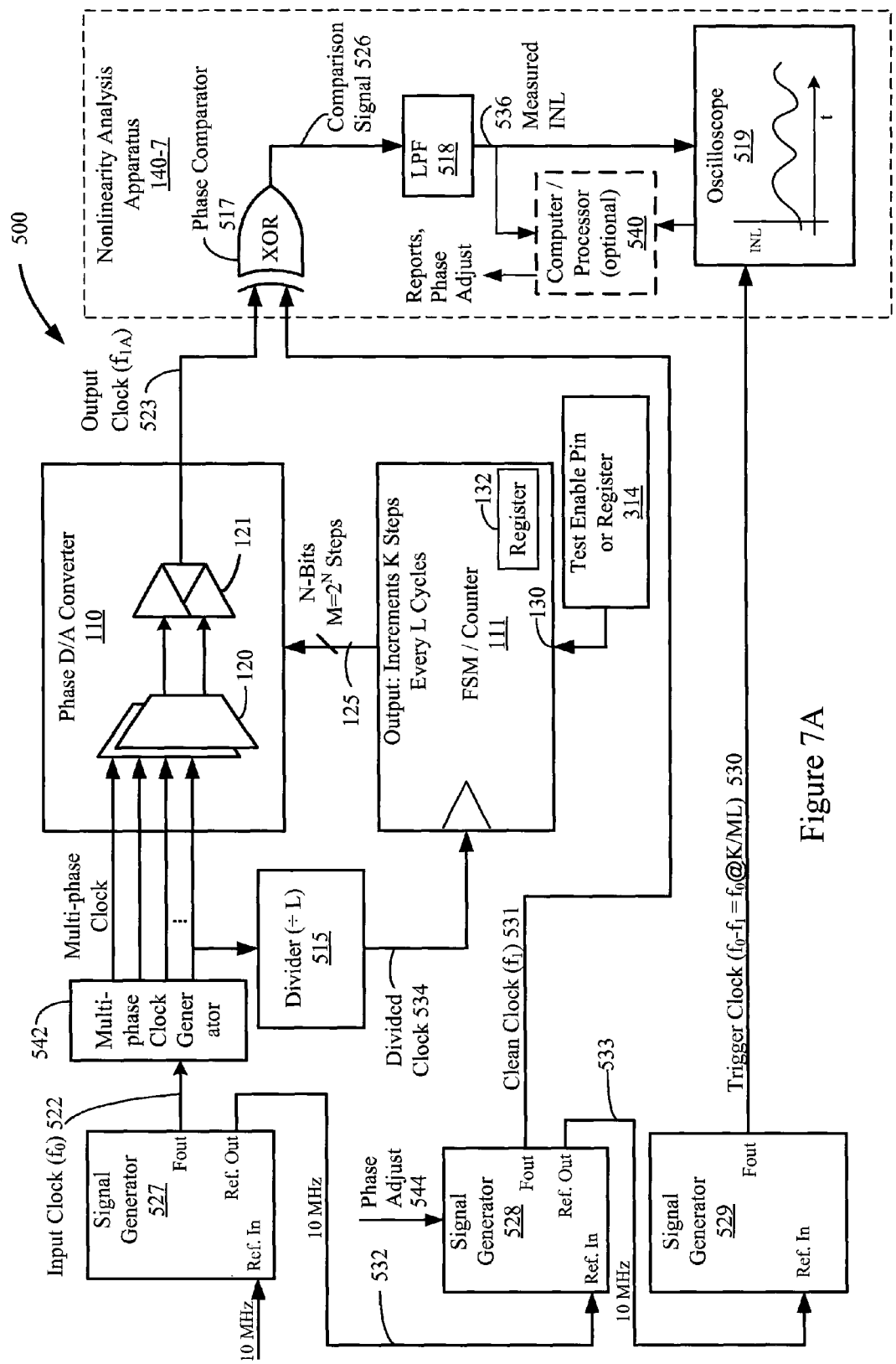
FIGS. 7A and 7B are block diagrams of circuits that can be used to characterize nonlinearities of a phase DAC using a time domain oscilloscope, in accordance with some embodiments.

FIG. 7A is a block diagram of an embodiment of a circuit 500 that can be used to characterize phase nonlinearities of a phase DAC using a time domain oscilloscope. The circuit 500 includes a phase DAC 110, a FSM/counter 111, a divider 515, signal generators 527, 528, and 529, and nonlinearity analysis apparatus 140-7. In some embodiments, the nonlinearity analysis apparatus includes a phase comparator 517 (e.g., an XOR gate or mixer), low pass filter (LPF) 518, and a time domain oscilloscope 519. The phase DAC 110 and FSM/counter 111 are described above.

Three signal generators 527-529 may be used to generate test clock signals. The first signal generator 527 receives a input reference clock (e.g., a 10 MHz clock signal) and generates input clock 522 having a frequency $f_0$ to feed a multiphase clock generator 542. Alternately, the first signal generator 527 may use an internal reference clock, in which case it does not need to receive an external reference clock. The second signal generator 528 receives a reference clock input 532 (e.g., a 10 MHz clock signal) generated by signal generator 527, and a phase adjust signal 544, and generates clean clock 531 having a frequency $f_1$ and a phase that is governed by the phase adjust 544.

The phase adjust 544 is a signal that controls the phase of the clean clock 531 relative to the phase of the output clock 523. In some embodiments, a computer or processor 540 (coupled to the measured INL 536 or the oscilloscope 519) varies the phase adjust 544 until the phase of the clean clock 531 leads the phase of the output clock 523 by approximately 90 degrees (or $\pi/4$ radians), or any other appropriate predefined amount. When the phase comparator 517 is an XOR gate or circuit, it generates two pulses for each clock cycle of the output clock 523. If the clean clock 531 leads the output clock 523 by 90 degrees, the average duty cycle of the comparison signal 526 (produced by the phase comparator) will be fifty percent (50%). Instantaneous deviations of the duty cycle from fifty percent are indicative of nonlinearities in the phase DAC 110. In some embodiments, the comparison signal 526 is a differential signal, while in other embodiments it is a single ended signal. When the comparison signal 526 is a differential signal, the magnitude of the differential-mode output of the LPF 518 is a measurement of the nonlinearity (INL), if any, of the phase DAC 110 in the region of operation associated with the current phase setting. When the comparison signal 526 is a single ended signal, the difference between the output of the LPF 518 and a predefined reference (e.g., the mid level between the highest and lowest values of the comparison signal 526) is a measurement of the nonlinearity (INL), if any, of the phase DAC 110 in the region of operation associated with the current phase setting.

The reference clock 532 serves to prevent the frequency of the clean clock 531 from drifting with respect to the input clock 522. The third signal generator 528 receives as an input a reference signal 533 generated by signal generator 529 and generates trigger clock 530 having a frequency equal to the difference between the input clock and the clean clock ($f_0 - f_1 = f_0 \cdot K/ML$). Again, the reference clock 533 (e.g., a 10 MHz clock signal) serves to prevent the frequency of the trigger clock 530 from drifting with respect to the clean clock 531.

The phase DAC 110 receives an input clock 522 having a frequency $f_0$ and generates an output clock 523 having an average frequency of $f_{1A}$. Divider circuit 515 receives input clock 522 and divides by an integer L to produce a divided clock 534. The divided clock 534 produced by divider 515 is coupled to the clock input of the FSM/counter 111. FSM/counter 111 generates an N-bit digital phase word 125 corresponding to a particular phase. The N-bit digital phase word 125 is received by phase DAC 110.

The phase comparator 517 (e.g., an XOR gate) receives as inputs the output clock 523 and the clean clock 527. The phase comparator 517 compares output clock 523 and clean clock 531 and generates comparison signal 526. Comparison signal 526 is received as an input by LPF 518. The LPF 518 generates an INL signal 536 ("measured INL"), which is received as an input by time domain oscilloscope 519. The oscilloscope 519 is triggered by trigger clock 530. If the output of the phase comparator 517 is a differential signal, and the phase DAC 110 is perfectly linear, the comparison signal 526 will have a duty cycle of fifty percent, and the average output of LPF 518 (measured INL 536) will be zero. Deviations of the measured INL 536 from zero are indicative of nonlinearities in the phase DAC 110.

Since the counter in FSM/counter 111 is incremented or decremented by a fixed value K each L cycles of the input clock 522, the output clock 523 has a frequency that is shifted with respect to input clock 522. Assuming that the value of L=1, the average frequency of the output clock 523 ($f_{1A}$) becomes $f_0+K/M$, where M is the total number of phase steps of the phase DAC 110. As discussed above, output clock 523 will typically contain nonlinearities due to the fact that not all phase steps are exactly equal in magnitude. If L is greater than one, the average frequency of the output clock 523 ($f_{1A}$) becomes $f_0+K/(ML)$.

Signal generator 528 is programmed to generate a clean clock 531 having a frequency of $f_1$, which is the same frequency as output clock 523 but does not contain the sidebands of output clock 523. The clean clock 531 can therefore be used as an ideal reference signal for comparison to output clock 523 in order to detect the nonlinearities of phase DAC 110. This comparison is performed by phase comparator 517, which generates a comparison signal 526 that indicates when the output clock and the clean clock do not coincide in time. For example, the phase comparator 517 may generate a comparison signal 526 whose voltage or current represents a logical zero whenever the output clock 523 and clean clock 531 are the same, and represents a logical 1 whenever the output clock 523 and clean clock 531 are not the same. The LPF 518 integrates the output of the comparison circuit to generate a signal proportional to any differences in phase between the output clock 523 and the clean clock 531. The resulting low pass filtered signal represents the phase deviation from an ideal transfer function at various points in the phase DAC 110 transfer function and can be displayed on a oscilloscope 519.

In order to provide a continuous repeating display of the phase DAC 110 input-to-output transfer function, the oscilloscope 519 must be triggered each time the phase DAC 110 has been swept through all of its phases. Signal generator 529 is programmed to generate a trigger clock having a frequency equal to the frequency of the input clock divided by the total number of input clock cycles (sometimes called "steps") per full rotation of the phase DAC 110. This trigger rate causes the oscilloscope to repeatedly display the instantaneous NL of the phase DAC 110. In this manner, the INL can be determined at any point in the transfer function with reference to the oscilloscope display 519. Further, the DNL can be determined by referencing the slope of the displayed INL at any given point in the transfer function of phase DAC 110.

This embodiment is not necessarily limited to the particular configuration of signal generators and reference signals. Other configurations of signal generators that produce the previously described input clock, clean clock, and trigger clock will suffice to allow efficient time domain measurement of phase linearity of a phase DAC using the aforementioned counter, comparator, and low pass filter. Moreover, the phase comparator 517 and/or low pass filter 518 can be implemented on or off the chip under test.

Production testing does not always require complete characterization of the input-to-output transfer function or even the DNL of the phase DAC. In some cases, only the peak INL is required in order to make a pass/fail determination or to bin chips into various tolerances. For these applications, the oscilloscope 519 and trigger signal generator 529 can be eliminated and replaced by a peak detector.

In some embodiments, the measured INL 536 is processed by a computer or processor 540 to generate a set of values indicative of nonlinearity of the phase DAC 110 under test. In some embodiments, the computer or processor 540 receives one value of the measured INL 536 for each cycle or predefined clock edge (e.g., an upward or downward clock edge) of the trigger clock 530. In some embodiments, the computer or processor 540 processes multiple measured INL values for the same phase DAC setting and generates the average INL value for the respective phase DAC setting to reduce measurement-related errors. The values generated by the computer or processor 540 may include one or more of the following: a set of INL values or average INL values for distinct phase settings of the phase DAC 110; a set of DNL values for distinct phase settings of the phase DAC 110, produced by taking the difference of the INL values or average INL values at each phase setting P and a neighboring setting (e.g., P-1 modulo M); maximum INL of the phase DAC, which is the largest INL for all the phase steps; and maximum DNL of the phase DAC, which is the largest DNL for all the phase steps. In some embodiments, the maximum INL and the maximum DNL are used to determine whether the phase DAC is useful for a particular task, or to quantify the quality of the phase DAC. Alternately, a peak detector (not shown) may be coupled to the measured INL 536 or to the oscilloscope 519 to produce a peak INL value or a peak DNL value.

Figure 7B:
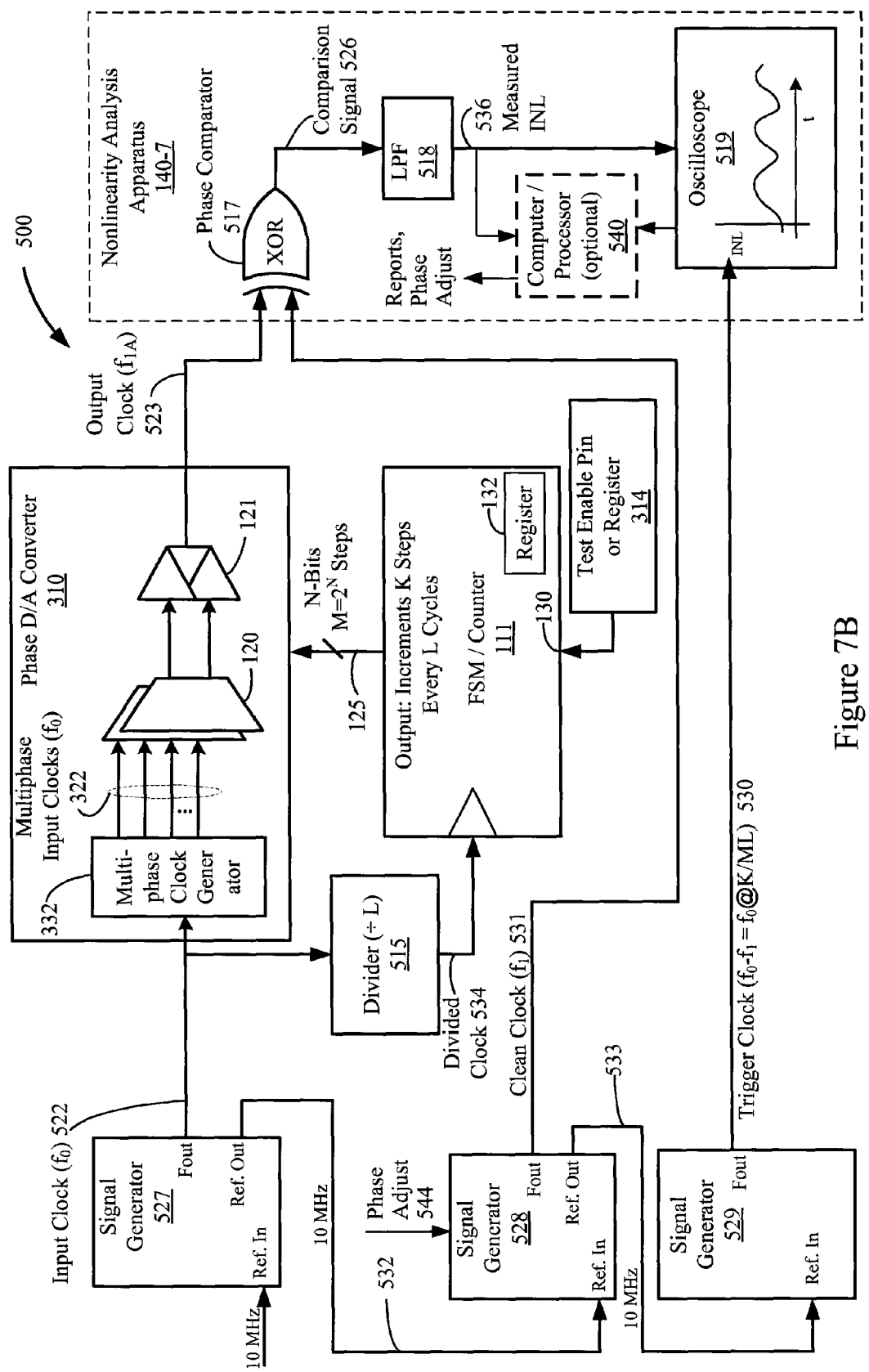

FIG. 7B represents an embodiment that is similar to FIG. 7A, except that the phase DAC 310 in FIG. 7B includes a multiphase clock generator 332 that receives an input clock 522 having a frequency of $f_0$ and produces N (e.g., four) multiphase input clocks 322 having evenly spaced phase offsets. In this embodiment, the input clock 522 drives the divider 515. The nonlinearity analysis generated by the nonlinearity analysis apparatus 140-7 includes any nonlinearities associated with the multiphase clock generator 332.

Figure 8:
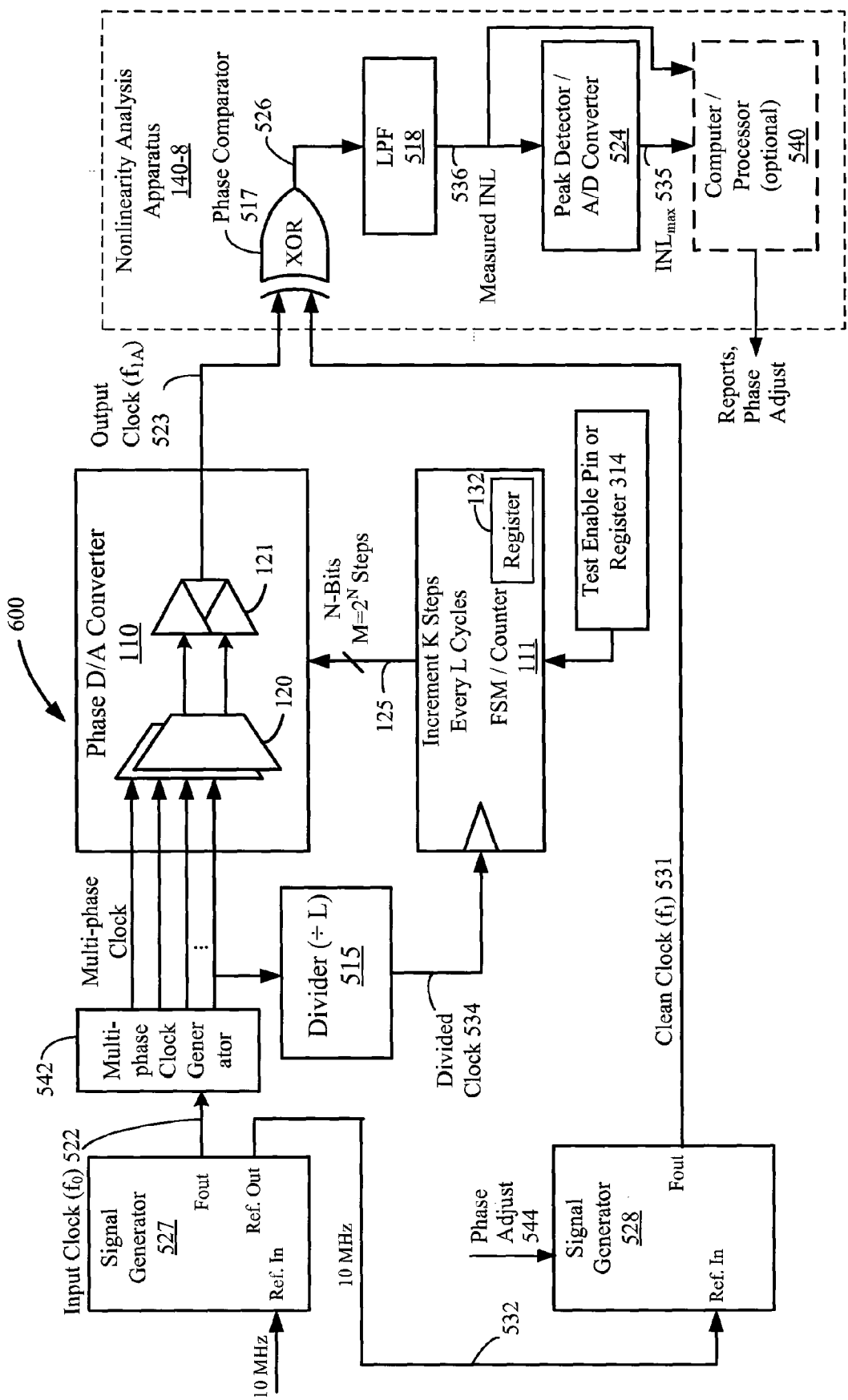
FIG. 8 is a block diagram of a circuit that can be used to detect peak INL (integral nonlinearity) of a phase DAC using a peak detector, in accordance with some embodiments.

FIG. 8 is a block diagram of another embodiment of a circuit 600 that can be used to detect peak INL of a phase DAC using a peak detector. Circuit 600 is the same as the circuit described in FIG. 7 except that the oscilloscope of the nonlinearity analysis apparatus 140-7 (FIG. 7) has been replaced with a peak detector or analog-to-digital converter (ADC) 524 in nonlinearity analysis apparatus 140-8. Consequently, the third signal generator 529 is not needed for generation of a trigger clock. The Measured INL 536 output by LPF 518 is received as an input by peak detector/ADC 524. Peak detector/ADC 524 generates an output 535 representing the peak absolute value of the integral non-linearity ($INL_{max}$). If the ADC is utilized, then $INL_{max}$ can be output as a digital word. Alternatively, the ADC can be eliminated and $INL_{max}$ can be output as an analog quantity. The $INL_{max}$ value can be used to automate production testing in order to screen chips, categorize chips into different groups, or to provide statistical information on the chips.

This embodiment is not necessarily limited to the particular configuration of signal generators and reference signals. Other configurations of signal generators that produce the previously described input clock and clean clock will suffice to allow efficient time domain measurement of phase linearity of a phase DAC using the aforementioned counter, comparator, and low pass filter. The phase comparator 517 and/or low pass filter can be implemented on or off the chip under test. Moreover, the peak detector can be implemented on or off the chip under test.

The foregoing descriptions of specific embodiments of the present invention are presented for purposes of illustration and description. They are not intended to be exhaustive or to limit the invention to the precise forms disclosed. Rather, it should be appreciated that many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:
1. A circuit comprising:
   a phase synthesizer to provide a synthesized output clock, the synthesized output clock having a frequency corresponding to an input clock coupled to an input of the phase synthesizer and a phase corresponding to a digital phase value input to the phase synthesizer;
a digital counter to provide the digital phase value to the input of the phase synthesizer, the digital counter receiving a counter clock synchronized with the input clock, the digital phase value being stepped by the digital counter in accordance with the counter clock, thereby shifting the frequency of the output clock with respect to the frequency of the input clock; and
nonlinearity analysis apparatus, coupled to the phase synthesizer, to analyze the synthesized output clock with respect to phase linearity of the phase synthesizer and to produce a phase linearity analysis output.

2. The circuit of claim 1, wherein the input clock is the counter clock.

3. The circuit of claim 2, wherein the nonlinearity analysis apparatus includes a spectrum analyzer that receives as an input the synthesized output clock and provides a frequency spectrum of the synthesized output clock.

4. The circuit of claim 3, further comprising a processor that receives as an input the frequency spectrum, wherein the processor is configured to calculate a root-mean-square integral nonlinearity of the phase synthesizer using the frequency spectrum.

5. The circuit of claim 4, wherein the phase synthesizer has M phase steps, and the processor is configured to calculate the root-mean-square integral nonlinearity in accordance with the following summation:

$$\frac{1}{\pi}\sum_{k=1}^{k=M/2} \mathcal{L}(kf_0/M),$$

where k is a summing index whose value ranges from 1 to M/2, $f_0$ is the frequency of the input clock, M is the number of phase steps of the phase synthesizer, and $L(k \cdot f_0/M)$ represents phase noise measurements at frequencies corresponding to $f_0(1+k/M)$.

6. The circuit of claim 3, wherein the nonlinearity analysis circuitry includes a processor that receives as an input the frequency spectrum, wherein the processor is configured to calculate a root-mean-square differential nonlinearity of the phase synthesizer using the frequency spectrum.

7. The circuit of claim 6, wherein the phase synthesizer has M phase steps, and the processor is configured to calculate the root-mean-square differential nonlinearity of the phase synthesizer in accordance with the following summation:

$$\frac{4}{\pi}\sum_{k=1}^{k=M/2} \mathcal{L}(kf_0/M)\cdot\sin^2(\pi k/(M+1)),$$

where k is a summing index whose value ranges from 1 to M/2, $f_0$ is the frequency of the input clock, M is the number of phase steps of the phase synthesizer, and $L(k \cdot f_0/M)$ represents phase noise measurements at frequencies corresponding to $f_0(1+k/M)$.

8. The circuit of claim 3, wherein the nonlinearity analysis circuitry includes a processor that receives as an input the frequency spectrum, wherein the processor is configured to perform a narrowband FM approximation to produce values representing an error signal, the error signal representing a difference between the synthesized output clock and an ideal output clock.

9. The circuit of claim 8, wherein the phase synthesizer has M phase steps, and the error signal $\epsilon\Phi(t)$ is represented, at least in part, by coefficients $C_k$ in the equation $$\varepsilon\Phi(t) = \sum_{k=-M/2}^{M/2} C_k e^{j2\pi k f_0 t/M},$$

where k is a coefficient index, and $f_0$ is the frequency of the input clock.

10. The circuit of claim 1, including:
a first divider circuit that receives as an input the input clock and divides the input clock, wherein the divided input clock is the counter clock, and
a second divider circuit that receives as an input the synthesized output clock and divides the synthesized output clock.

11. The circuit of claim 10, wherein the first divider circuit divides the input clock by an integer L, and the second divider circuit divides the synthesized output clock by the integer L to produce a divided synthesized output clock.

12. The circuit of claim 11, wherein the nonlinearity analysis apparatus includes a spectrum analyzer that receives as an input the divided synthesized output clock and provides a frequency spectrum of the divided synthesized output clock.

13. The circuit of claim 12, wherein the nonlinearity analysis apparatus includes a processor that receives as an input the frequency spectrum, wherein the processor is configured to calculate a root-mean-square integral nonlinearity of the phase synthesizer using the frequency spectrum.

14. The circuit of claim 13, wherein the phase synthesizer has M phase steps, and the processor is configured to calculate the root-mean-square integral nonlinearity in accordance with the following summation:

$$\frac{1}{\pi}\sum_{k=1}^{M/2} \mathcal{L}(kf_1/(ML)),$$

where k is a summing index whose value ranges from 1 to M/2, $f_0$ is the frequency of the input clock, $f_1$ is the frequency of the divided input clock ($=f_0/L$), and $L(k \cdot f_1/ML)$ represents phase noise measurements at frequencies corresponding to $f_1(1+k/ML)$.

15. The circuit of claim 12, wherein the nonlinearity analysis circuitry includes a processor that receives as an input the frequency spectrum, wherein the processor calculates a root-mean-square differential non-linearity of the phase synthesizer using the frequency spectrum.

16. The circuit of claim 15, wherein the phase synthesizer has M phase steps, and the processor is configured to calculate the root-mean-square differential nonlinearity of the phase synthesizer in accordance with the following summation:
$4/\pi*L(k \cdot f_1/ML)\cdot\sin^2(\pi k/(M+1)L)$, where k is a summing index whose value ranges from 1 to M/2, $f_0$ is the frequency of the input clock, $f_1$ is the frequency of the divided input clock ($=f_0/L$), M is the number of phase steps of the phase synthesizer, and $L(k \cdot f_1/ML)$ represents phase noise measurements at frequencies corresponding to $f_1(1+k/ML)$.

17. The circuit of claim 10, wherein the first divider circuit divides the input clock by an integer L, and the second divider circuit divides the synthesized output clock by an integer equal to the product of (L·P), where L and P and both integers greater than one.

18. The circuit of claim 1, further comprising:
a first divider circuit that receives and divides the input clock to produce a divided input clock, wherein the divided input clock is the counter clock;
a first signal generator receiving a first reference clock as a reference input and generating the input clock coupled to an input of the phase synthesizer, the first signal generator generating a second reference clock;
a second signal generator receiving the second reference clock and generating a clean clock having a frequency equal to the shifted average frequency of the output clock of the phase synthesizer and a stable phase;
a phase comparator receiving the output clock and the clean clock, the phase comparator comparing the output clock to the clean clock and generating a difference signal; and
a lowpass filter receiving as an input the difference signal and generating as an output a filtered difference signal.

19. The circuit of claim 18, further comprising:
a third signal generator receiving a third reference clock generated by the second signal generator and generating a trigger clock; and
an oscilloscope receiving and displaying the filtered difference signal, the oscilloscope being triggered by the trigger clock, wherein the display of the filtered difference signal is a waveform representing an integral nonlinearity of the phase synthesizer.

20. The circuit of claim 18, wherein the nonlinearity analysis circuitry includes a peak detector receiving as an input the filtered difference signal, the peak detector detecting a peak value of the filtered difference signal.

21. The circuit of claim 20, wherein the nonlinearity analysis circuitry includes an analog-to-digital converter receiving the detected peak value of the filtered difference signal and converting that value into a digital number.

22. The circuit of claim 1, further comprising a register having a test enable bit, wherein the test enable bit can be set to enable the stepping of the digital counter.

23. The circuit of claim 1, further comprising a test enable pin, wherein the test enable pin can be set to a logic level to enable the stepping of the digital counter.

24. A method of determining phase linearity of a phase synthesizer having a phase selectable output clock, comprising:
using the phase synthesizer, synthesizing an output clock, the synthesized output clock having a frequency corresponding to an input clock coupled to an input of the phase synthesizer and a phase corresponding to a digital phase value input to the phase synthesizer;
using circuitry, stepping the phase of the synthesized output clock in accordance with a counter clock synchronized with the input clock; and
analyzing the synthesized output clock with respect to phase linearity of the phase synthesizer to produce a phase linearity analysis output.

25. A method of determining the phase linearity of a phase synthesizer having a phase selectable output clock, comprising:
periodically stepping the phase of the output clock of the phase synthesizer by a fixed step;
obtaining a frequency spectrum of the output clock of the phase synthesizer;
measuring sideband peaks in the frequency spectrum; and
converting the measurements of the sideband peaks into values representing the phase linearity of the phase synthesizer.

26. The method of claim 25, further comprising:
converting an input clock into the output clock, the output clock having a frequency corresponding to the input clock and a phase corresponding to a digital phase value; and
stepping the digital phase value once each cycle of the input clock.

27. The method of claim 25, wherein converting the measurements includes calculating a root-mean-squared integral nonlinearity of the phase synthesizer using the frequency spectrum.

28. The method of claim 27, wherein the phase synthesizer has M phase steps, and the calculation of the root-mean-squared integral nonlinearity of the phase synthesizer is in accordance with the following summation:

$$\frac{1}{\pi} \sum_{k=1}^{k=M/2} \mathcal{L}(kf_0/M)),$$

where k is a summing index whose value ranges from 1 to M/2, M is the number of phase steps of the phase synthesizer, $f_0$ is the frequency of the input clock, and $L(k \cdot f_0/M)$ represents phase noise measurements at frequencies corresponding to $f_0(1+k/M)$.

29. The method of claim 25, wherein the phase synthesizer has M phase steps, and the method includes calculating a root-mean-square differential nonlinearity of the phase synthesizer in accordance with the following summation:

$$\frac{4}{\pi} \sum_{k=1}^{k=M/2} \mathcal{L}(kf_0/M) \cdot \sin^2(\pi k/(M+1)),$$

where k is a summing index whose value ranges from 1 to M/2, $f_0$ is the frequency of the input clock, M is the number of phase steps of the phase synthesizer, and $L(k \cdot f_0/M)$ represents phase noise measurements at frequencies corresponding to $f_0(1+k/M)$.

30. A method of determining the phase linearity of a phase synthesizer having a phase selectable output clock, comprising:
converting an input clock into the output clock, the output clock having a frequency corresponding to the input clock and a phase corresponding to a digital phase value; and
stepping the digital phase value once each L cycles of the input clock, where L is an integer greater than one;
dividing the output clock of the phase synthesizer; and
obtaining a frequency spectrum of the divided output clock of the phase synthesizer.

31. The method of claim 30, further comprising processing the frequency spectrum to produce a root-mean-squared integral nonlinearity of the phase synthesizer, and producing an output representative of the root-mean-square integral nonlinearity of the phase synthesizer.

32. The method of claim 31, wherein the phase synthesizer has M phase steps; the method including determining the root-mean-square integral nonlinearity in accordance with the following summation:

$$\frac{1}{\pi}\sum_{k=1}^{k=M/2}\mathcal{L}(kf_0/M),$$

where k is a summing index whose value ranges from 1 to M/2, $f_0$ is the frequency of the input clock, M is the number of phase steps of the phase synthesizer, and $L(k \cdot f_0/M)$ represents phase noise measurements at frequencies corresponding to $f_0(1+k/M)$.

33. The method of claim 30, wherein the phase synthesizer has M phase steps, and the method includes
calculating a root-mean-square differential nonlinearity of the phase synthesizer in accordance with the following summation:

$$\frac{4}{\pi}\sum_{k=1}^{k=M/2}\mathcal{L}(kf_0/M)\cdot\sin^2(\pi k/(M+1)),$$

where k is a summing index whose value ranges from 1 to M/2, $f_0$ is the frequency of the input clock, M is the number of phase steps of the phase synthesizer, and $L(k \cdot f_0/M)$ represents phase noise measurements at frequencies corresponding to $f_0(1+k/M)$; and producing an output representative of the root-mean-square differential nonlinearity of the phase synthesizer.

* * * * *